US010062576B2

(12) United States Patent
Launay et al.

(10) Patent No.: US 10,062,576 B2
(45) Date of Patent: Aug. 28, 2018

(54) METHOD FOR PLASMA ETCHING A WORKPIECE (71) Applicant: SPTS TECHNOLOGIES LIMITED, Newport (GB)

(72) Inventors: Nicolas Launay, Annecy (FR); Maxine Varvara, Copponex (FR)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 15/588,779

(22) Filed: May 8, 2017

(65) Prior Publication Data

US 2017/0338124 A1 Nov. 23, 2017

(30) Foreign Application Priority Data

May 20, 2016 (GB) .................................. 1608926.0

(51) Int. Cl.
*H01L 21/3065* (2006.01)
*H01J 37/305* (2006.01)
(Continued)

(52) U.S. Cl.
CPC .... *H01L 21/30655* (2013.01); *H01J 37/3053* (2013.01); *H01J 37/32082* (2013.01);
(Continued)

(58) Field of Classification Search
CPC ......... H01L 21/30655; H01L 21/67069; H01L 21/6831; H01L 21/76898; H01J 37/3053;
(Continued)

(56) References Cited

U.S. PATENT DOCUMENTS 6,008,133 A * 12/1999 Kunnihashi ....... H01J 37/32082
216/67
6,759,339 B1 7/2004 Choi et al.
(Continued)

FOREIGN PATENT DOCUMENTS

EP 0822582 A2 2/1998
EP 1336984 A2 8/2003
(Continued)

OTHER PUBLICATIONS

"Matching an RF Sheath Model to a Bulk Plasma Model", IEEE Transactions on Plasma Science, IEEE Service centre, Piscataway, NJ, US, vol. 23, No. 4, Aug. 1, 1995 (Aug. 1, 1995), pp. 717-727, XP000983862, ISSN: 0093-3813, DOI: 10.1109/27.467994.

*Primary Examiner* — Duy Vu N Deo
(74) *Attorney, Agent, or Firm* — Volentine, Whitt & Francos, PLLC (57) ABSTRACT

A method of plasma etching one or more features in a silicon substrate includes performing a main etch using a cyclical etch process in which a deposition step and an etch step are alternately repeated, and performing an over etch to complete the plasma etching of the features. The over etch includes one or more etch steps of a first kind and one or more etch steps of a second kind, each of the etch steps of the first and second kind include etching by ion bombardment of the silicon substrate. The ion bombardment during the one or more etch steps of the second kind has an inward inclination with respect to ion bombardment during the one or more etch steps of the first kind.

19 Claims, 6 Drawing Sheets

(51) Int. Cl.
*H01J 37/32* (2006.01)
*H01L 21/67* (2006.01)
*H01L 21/683* (2006.01)
*H01L 21/768* (2006.01)

(52) U.S. Cl.
CPC .. *H01J 37/32366* (2013.01); *H01J 37/32403* (2013.01); *H01J 37/32422* (2013.01); *H01J 37/32577* (2013.01); *H01L 21/67069* (2013.01); *H01L 21/6831* (2013.01); *H01L 21/76898* (2013.01); *H01J 2237/334* (2013.01)

(58) Field of Classification Search
CPC ........... H01J 37/32082; H01J 37/32366; H01J 37/32403; H01J 37/32422; H01J 37/32577
See application file for complete search history.

(56) References Cited

U.S. PATENT DOCUMENTS

| | | |
|---|---|---|
| 7,838,430 B2 | 11/2010 | Shannon et al. |
| 8,343,306 B2 | 1/2013 | Tanaka et al. |
| 2003/0201069 A1 | 10/2003 | Johnson |
| 2010/0006225 A1 | 1/2010 | Yokogawa et al. |
| 2013/0230971 A1 | 9/2013 | Geerpuram et al. |
| 2014/0361102 A1 | 12/2014 | Hatoh et al. |
| 2015/0011093 A1* | 1/2015 | Singh ................ H01J 37/32422 438/712 |
| 2015/0311073 A1* | 10/2015 | Srinivasan .......... H01L 29/0684 438/504 |

FOREIGN PATENT DOCUMENTS

| | | |
|---|---|---|
| JP | 2007134530 A | 5/2007 |
| WO | WO89/03899 A1 | 5/1989 |

\* cited by examiner

METHOD FOR PLASMA ETCHING A WORKPIECE

BACKGROUND

According to the invention there is provided a method and an apparatus for plasma etching a workpiece.

The etching of silicon wafers is an important process in the industrial manufacture of electronic components. It is preferable for the etching profile to be uniform across the entire surface of the wafer. Ideally, such a uniform and high quality etch should be achieved to within 3 mm of the wafer edge to prevent unnecessary waste of the wafer material.

Figure 1:
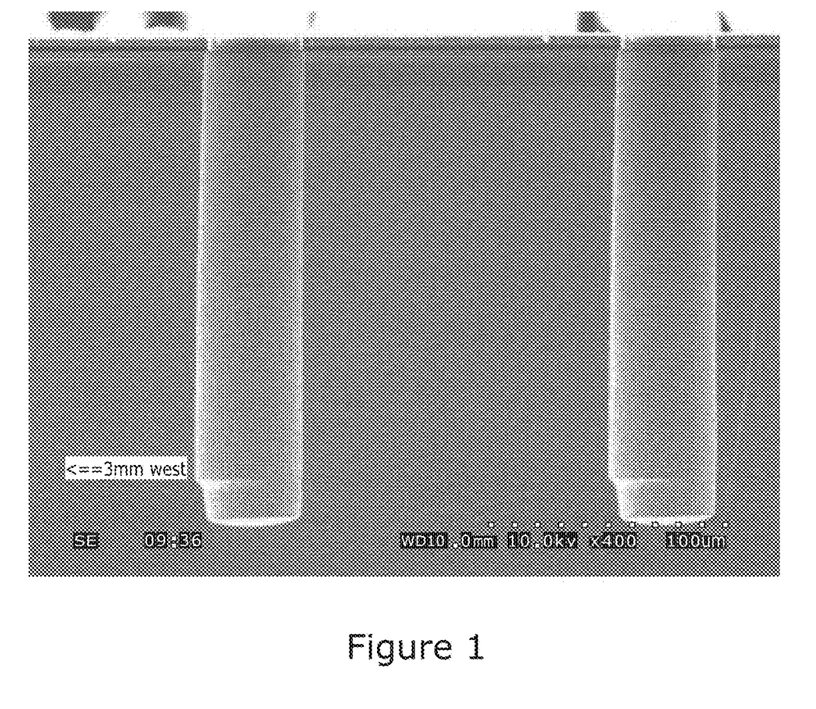
FIG. 1 is an SEM image showing an asymmetry defect in a via.

Current methods used to etch a silicon wafer include plasma etching using a cyclical technique commonly known as the "Bosch process". In this technique, alternate deposition steps and etch steps are performed cyclically. The Bosch process is well-known in the art and is described, for example, in U.S. Pat. No. 5,501,893. However, due to a number of discontinuities towards the wafer edge, such as changes in gas flow, temperature and plasma density, it can be difficult to maintain the uniformity of this plasma etch process. Methods to control the plasma uniformity and minimise these edge effects include using electrostatic chucks (ESCs), gas flow management, and platen assemblies which are larger than the wafer. Focus rings, which may be ceramic or silicon annular rings, may also be used to control the plasma uniformity. However, the plasma uniformity may deviate during the plasma etch process as process conditions, such as RF power and chamber pressure, fluctuate. This can lead to asymmetries in the plasma etch process, in particular towards the wafer edge where the incident angle of ion bombardment can be more difficult to control and reproduce. An SEM image of such an asymmetry at the base of a via etched in silicon is shown in FIG. 1. Such an asymmetry would lead to defective die.

Figure 2:
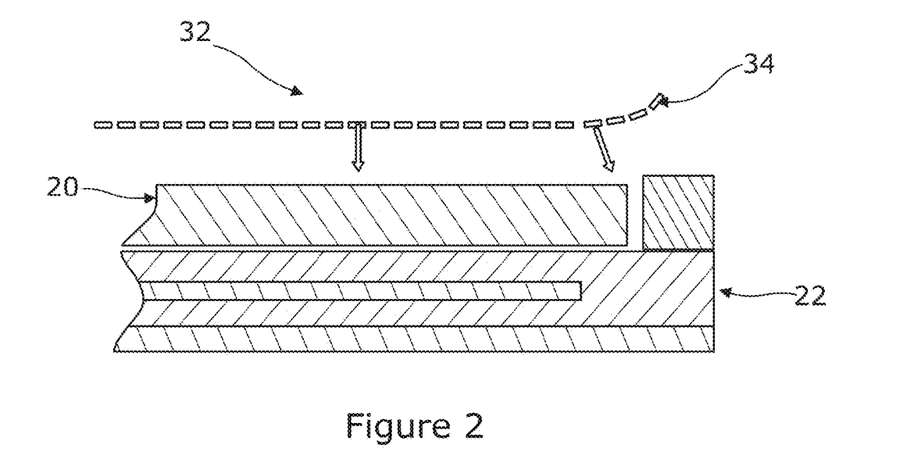
FIG. 2 is a schematic cross-section of a plasma etch step where the plasma sheath has an outward tilt at the edge of the substrate.

In the plasma etching of silicon wafers, a negative polarisation of the wafer surface is typically achieved such that positive ions from the plasma are attracted to the surface of the wafer. The region in the plasma from where the positive ions have been extracted is known as the plasma sheath. The positive ions bombard the wafer surface in a direction generally perpendicular from the plasma sheath. Therefore distortions in the thickness or tilt of the plasma sheath will lead to non-uniformities in the etched surface. The tilt of the plasma sheath corresponds to the incident angle at which ions bombard the surface of the substrate. The tilt angle is measured between the incident path of the ions and the normal to the wafer surface. The incident angle of ion bombardment at the edge of the wafer may be tilted with respect to the incident angle of ion bombardment at the centre of the wafer. The thickness and tilt of the plasma sheath is dependent upon plasma density, local potential and topology of the wafer. These parameters vary throughout the process chamber and lead to variation in plasma sheath thickness across the surface of the wafer. This plasma sheath distortion is most pronounced at the wafer edge where material and mechanical discontinuities are present. For example, there is often a local voltage variation on the surface of the substrate towards the wafer edge. This generates a distortion in the plasma sheath thickness and can lead to an asymmetric etch or an etch with a tapered profile. FIG. 2 illustrates a cross-section of the edge of a substrate 20 placed on a RF driven electrostatic chuck (ESC) 22 in the presence of a plasma, where the plasma sheath 34 has an outward tilt at the edge of the substrate 20. The substrate 20 is positioned on an ESC 22 and exposed to a plasma 32 generated using a suitable etchant source gas. In this example, the plasma sheath 34 has an outward tilt at the edge of the substrate 20 such that the incident angle of ions bombarding the substrate surface has a radially outward component.

The plasma etching process may involve a main etch followed by an over etch, which is typically commenced once an end-point condition has been detected. The main etch cycle is also known as a bulk etch. The main etch may utilise the cyclic deposition and etch Bosch process. The main etch can be used to form trenches or vias, and the over etch cycle is performed to ensure that the etch profile is uniform and complete across the wafer surface, and to remove any other residual material from the vias which were deposited from the main etch process. An initial, "breakthrough" etch step may also be performed. In general, different etch recipes and process parameters are used during the breakthrough etch, Bosch main etch and over etch sequences.

The tilt of the plasma sheath can be optimised during the over etch cycle such that the over etch is aligned as far as possible with the main etch. In general, this involves adjusting the process parameters to minimise the plasma distortions between the main etch cycle and the over etch cycle, which can often be complicated. Despite the process parameter optimisations, there are usually small variations in the plasma sheath between the main etch and the over etch. However, even small variations in the tilt between the main etch and the over etch can lead to a tapered or asymmetrical profile for the over etch. Such asymmetries will become more pronounced at the base of features such as vias with a high aspect ratio. These asymmetries may lead to defective die.

SUMMARY

It will be appreciated that, in addition to the specific problems described above, there is a general desire and need to improve the uniformity of the plasma etch process, in particular at the periphery of the wafer and reduce the number of asymmetries present after an over etch process. The present invention, in at least some of its embodiments, addresses at least some of these problems, desires and needs.

According to a first aspect of the invention there is provided a method of plasma etching one or more features in a silicon substrate, the method comprising the steps of:

performing a main etch using a cyclical etch process in which a deposition step and an etch step are alternately repeated; and performing an over etch to complete the plasma etching of the features;

in which:

the over etch comprises one or more etch steps of a first kind and one or more etch steps of a second kind, each of the etch steps of the first and second kind comprising etching by ion bombardment of the silicon substrate; and ion bombardment during the one or more etch steps of the second kind has an inward inclination with respect to ion bombardment during the one or more etch steps of the first kind.

The main etch may be preceded by a breakthrough etch step. The main etch is performed to etch the major portion of the one or more features in the silicon substrate. The over etch completes the plasma etching of the features and removes residues from these features that may be leftover from the main etch. It will be apparent that the ion bombardment during the one or more etch steps of the first kind has an outward inclination with respect to ion bombardment during the one or more etch steps of the second kind. The one or more etch steps of the first and second kind may be performed in any order. An inward inclination corresponds to an ion bombardment with a radially inward component. That is, radially towards the centre of the silicon substrate. An outward inclination corresponds to an ion bombardment with a radially outward component. That is, radially away from the centre of the silicon substrate.

The over etch may further comprise one or more etch steps of a third kind, the one or more etch steps of the third kind comprising etching by ion bombardment of the silicon substrate. Ion bombardment during the one or more etch steps of the third kind may have an outward inclination with respect to ion bombardment during the one or more etch steps of the first kind. In these embodiments, ion bombardment during the one or more etch steps of the first kind has an inclination which is intermediate to the inclinations of the ion bombardment during the etch steps of the second and third kinds. The one or more etch steps of the first kind may constitute an optimised or best fit to the main etch so that, if the over etch consisted solely of the etch steps of the first kind, the lower end of the resulting feature would have the best, or close to the best, possible degree of symmetry. The etch steps of the second and third kinds may then be performed to correct asymmetries introduced by the one or more etch steps of the first kind.

The invention can provide particular improvements in the symmetry of features etched towards the periphery of the silicon substrate, particularly features located close to the edge of the silicon substrate.

The one or more steps of the first, second and third kind may be performed in any order.

The inclination of the ion bombardment during the over etch may be controlled using an electrical bias power which is applied to the substrate to produce an electrical bias. The electrical bias power may be an RF power. Without wishing to be limited by any particular theory or conjecture, it is believed that the inclination of the ion bombardment is controlled by altering the tilt of the plasma sheath that is generated as part of the plasma etching.

The electrical bias power may be pulsed during one or more of the etch steps of the first, second and, optionally, the third kind.

The electrical bias power may be pulsed with a duty cycle in the range of 10 to 50% during one or more of the etch steps of the first, second and, optionally, the third kind.

The electrical bias power may be applied to the substrate continuously during one or more of the etch steps of the first, second and, optionally, the third kind.

The inward inclination of the ion bombardment during the one or more etch steps of the second kind may be controlled by reducing the magnitude of the electrical bias power in comparison to the electrical bias power applied during the one or more etch steps of the first kind.

The outward inclination of the ion bombardment during the one or more etch steps of the third kind may be controlled by increasing the magnitude of the electrical bias power in comparison to the electrical bias power applied during the one or more etch steps of the first kind.

The inclination of the ion bombardment during the over etch may be controlled in other ways, such as by applying an electrical signal to a focus ring that surrounds the silicon substrate.

The features may be vias. The features may be Through Silicon Vias (TSVs).

The features may have an aspect ratio of at least 5:1.

The silicon substrate may include an outer protective layer, where the outer protective layer may be an oxide layer, for example silicon dioxide. A breakthrough etch may be performed to remove the outer protective layer.

The over etch may comprise a plurality of etch steps of the first kind, a plurality of etch steps of the second kind and a plurality of etch steps of the third kind.

The over etch may comprise the steps of:
performing an etch cycle comprising a deposition step and an etch step of the first kind, whereby the deposition step and the etch step of the first kind are alternately repeated;
performing an etch cycle comprising a deposition step and an etch step of the second kind, whereby the deposition step and the etch step of the second kind are alternately repeated; and
performing an etch cycle comprising a deposition step and an etch step of the third kind, whereby the deposition step and the etch step of the third kind are alternately repeated.

The over etch may comprise the steps of:
performing an etch cycle comprising at least one deposition step, an etch step of the first kind, an etch step of the second kind and an etch step of the third kind; and repeating said etch cycle. The etch steps of the first, second and third kind may be performed in any order.

Each etch step of the first, second and third kind in the etch cycle may be preceded by a corresponding deposition step.

The etch cycle may comprise a single deposition step followed by etch steps of the first, second and third kind. The etch steps of the first, second and third kind may be performed in any order.

The etch steps of the first, second and third kind may be performed using a plasma formed using a fluorine containing gas. The fluorine containing gas may be $SF_6$.

The over etch may comprise at least one deposition step which is performed using a plasma formed using a fluorocarbon. The fluorocarbon may be $C_4F_8$.

According to a second aspect of the invention there is provided an apparatus for etching a silicon substrate according to the first aspect of the invention comprising:
a chamber;
a substrate support positioned within the chamber for supporting the silicon substrate;
a plasma production device for producing at least one plasma for use in etching the silicon substrate;
a control device configured to control the inclination of the ion bombardment during the over etch;
in which the control device comprises an electrical bias power supply for supplying an electrical bias power which is applied to the substrate to produce an electrical bias and thereby control the inclination of the ion bombardment during the over etch.

The electrical bias power may be applied to the substrate via the substrate support.

The substrate support may comprise an electrostatic chuck (ESC). The substrate support may comprise an electrode extending beyond the edge of the substrate, in which the electrical bias power is applied to said electrode.

The electrical bias power supply may comprise an RF power supply for supplying an RF electrical bias power which is applied to the substrate. The RF electrical bias power may be applied to the substrate via the substrate support.

Whilst the invention has been described above, it extends to any inventive combination of the features set out above or in the following description, drawings or claims. For example, any feature described in relation with the first aspect of the invention is considered to be disclosed also in relation to the second aspect of the invention.

BRIEF DESCRIPTION OF THE DRAWINGS

Embodiments of methods and apparatus in accordance with the present invention will now be described, by way of example only, and with reference to the accompanying drawings, in which.

DETAILED DESCRIPTION OF EMBODIMENTS

Figure 3:
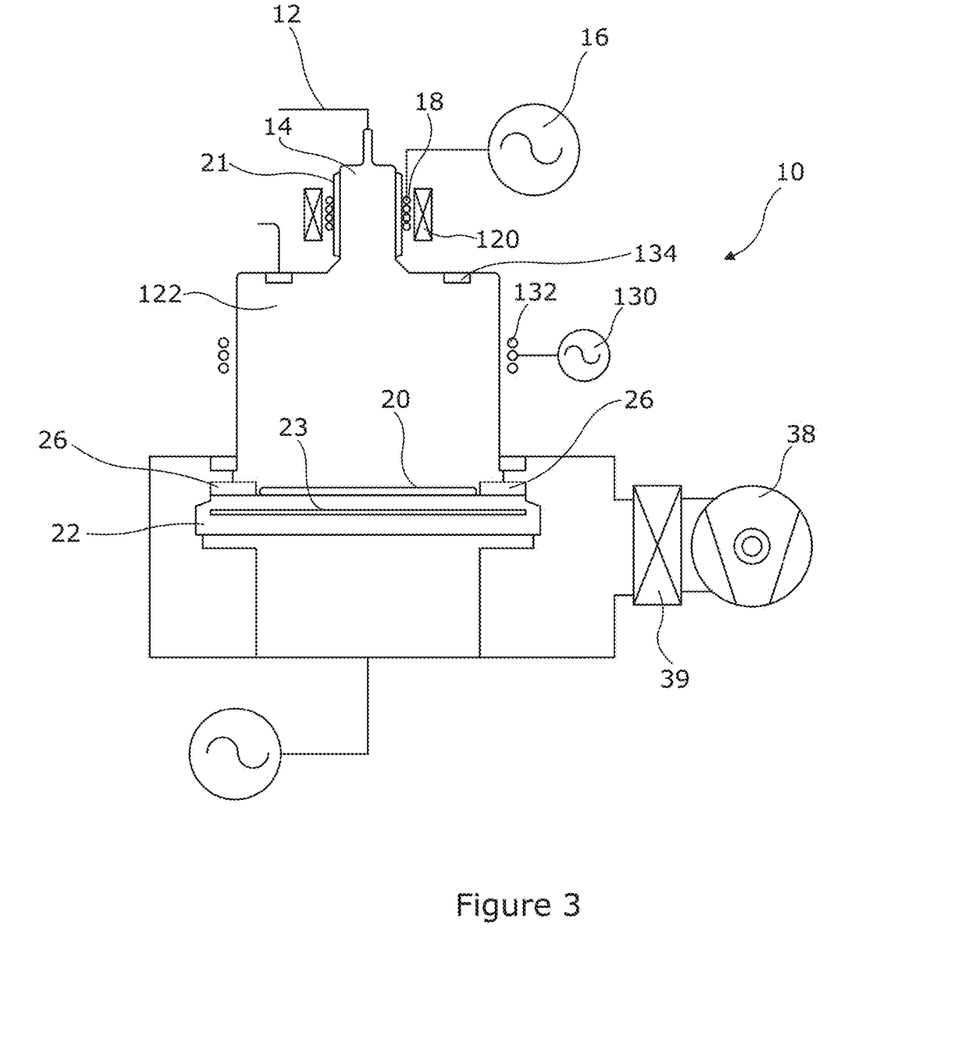
FIG. 3 is a schematic cross-section of an apparatus suitable for plasma etching a substrate.

FIG. 3 depicts an apparatus 10 suitable for plasma etching a silicon substrate 20 according to the present invention. The primary gas feed 12 enters the primary chamber 14 which has an associated primary ionisation source 16. An RF antenna 18, nominally 13.56 MHz, acts as the inductively coupled plasma (ICP) source. A Faraday shield 21 can be provided between the DC coil 120 and the wall of the primary chamber 14 to reduce capacitive coupling. The plasma from the primary source enters the main chamber 122 where the substrate 20 is positioned on top of a substrate support or platen 22, which may be an electrostatic chuck (ESC). The ESC helps to clamp the substrate to the platen 22 and to help cool the substrate during the plasma etch process. The ESC comprises an RF driven electrode 23 that extends beyond the edge of the substrate 20. The main chamber 122 has a secondary ionisation source 130 having a secondary RF coil 132 placed around the main chamber 122 to provide a secondary plasma close to the main chamber wall. An annular gas distribution system 134 may be incorporated into the main chamber 122 to provide an independent gas source for the secondary plasma. Gas flows in a radial fashion to the pump 38 through a gate valve 39. The substrate 20 may be positioned in a focus ring 26. The platen 22 may comprise an HF/LF electrode. The platen 22, and hence the substrate 20, may be polarised by applying a potential to the HF/LF electrode. During an etch process, a negative polarisation is applied to the platen 22 in order to attract positive ions from the plasma 32. The positive ions extracted from the plasma 32 lead to the formation of a plasma sheath 34. The positive ions bombard the surface of the substrate 20 in a direction perpendicular from the plasma sheath 34 and etch the surface of the substrate 20. The incident angle at which the positive ions bombard the surface of the substrate is defined as the tilt of the plasma sheath. References herein to an inward tilt correspond to ions bombarding the substrate surface with an inward inclination or radially inward component. That is, towards the centre of the substrate 20. References herein to an outward tilt correspond to ions bombarding the substrate surface with an outward inclination or radially outward component. That is, away from the centre of the substrate 20. It will be appreciated that the apparatus shown in FIG. 3 is only an example of a suitable apparatus and other embodiments are possible. For example, apparatus having a single chamber or a single ionization source might be used.

Figure 4:
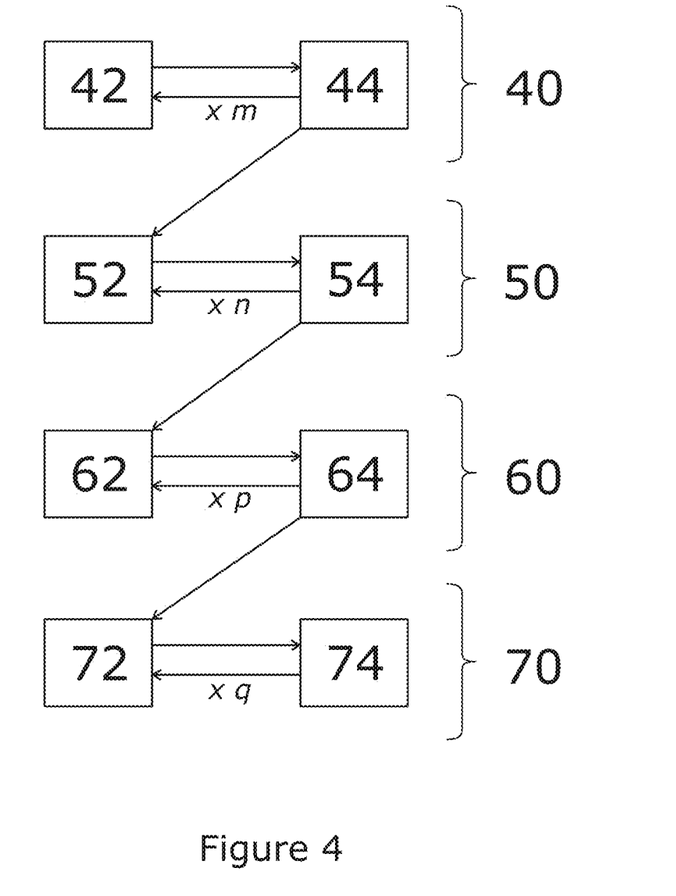
FIG. 4 is a flow diagram showing a first method of plasma etching a substrate according to the invention.

In a first embodiment there is a method for plasma etching a substrate 20 as shown by the flow chart in FIG. 4. The substrate 20 is first subjected to a main etch cycle 40. The main etch cycle 40 comprises a deposition step 42 and a plasma etch step 44, which are repeated m times until features, such as trenches or vias 45, have been formed in the substrate 20. Each deposition step 42 and plasma etch step 44 may be performed for a time in the range 0.5 to 10 seconds. The deposition 42 and etch 44 steps may be alternately repeated at least ten times, however, the number of cycles can be any number suitable to achieve the required process end point. In particular, there is no particular upper limit to the number of cycles. The deposition step 42 and subsequent deposition steps in this embodiment and in further embodiments may be performed using a plasma formed from a suitable source gas, such as a fluorocarbon, for example $C_4F_8$. The etch step 44 and subsequent etch steps in this embodiment and further embodiments may be performed using a plasma formed from a suitable etching gas or gas mixture, such as a fluorine containing gas, for example $SF_6$. The substrate may comprise an etch stop to prevent the etch from continuing too far. By way of example only, the etch stop may be composed of silicon nitride (SiN) to ensure tight control of the etch depth.

Figure 5A:
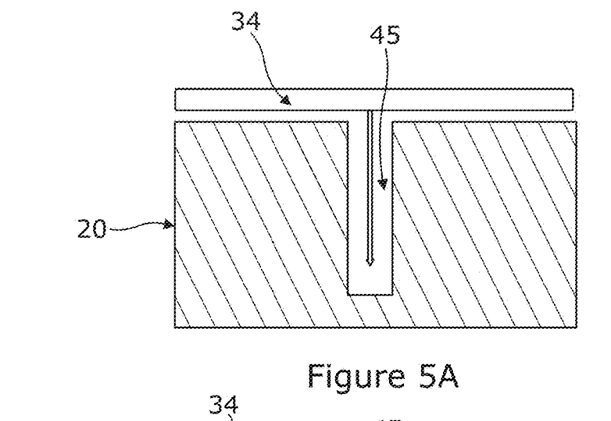
FIG. 5A is a schematic diagram of a main or bulk etch process using a plasma.
Figure 5B:
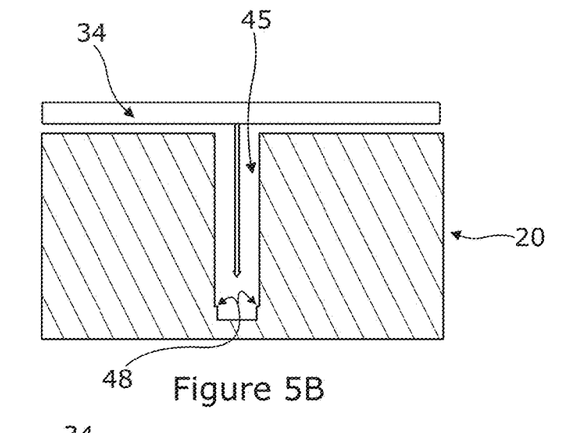
FIG. 5B is a schematic diagram of an over etch process using a plasma sheath with an optimised tilt.
Figure 6:
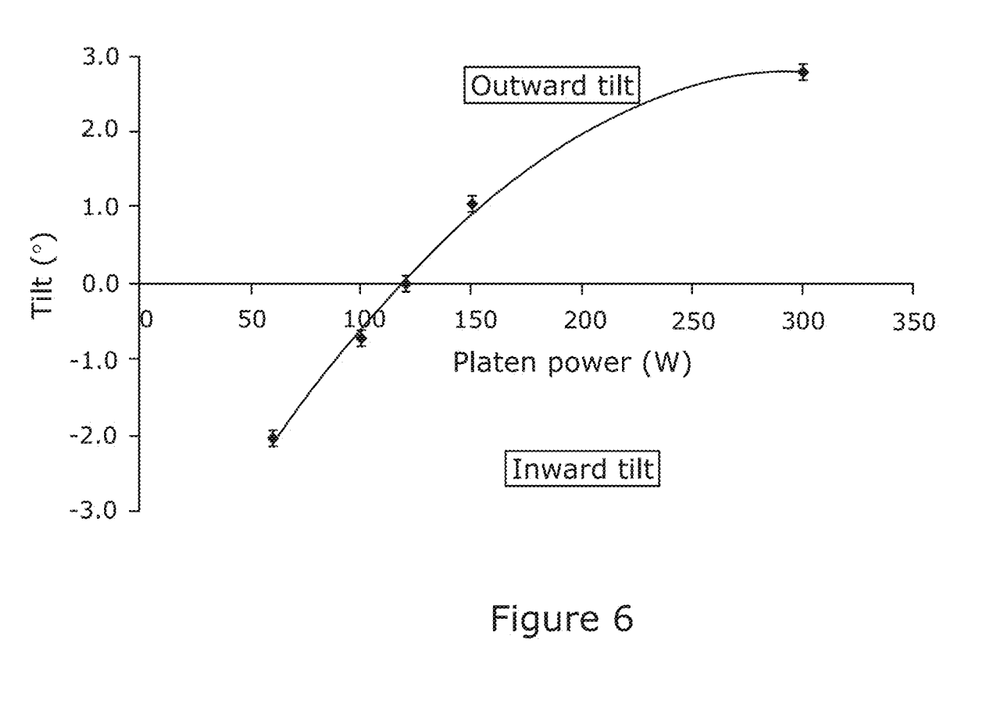
FIG. 6 is a plot of plasma sheath tilt angle as a function of platen power.

After the main etch cycle 40 is complete and features, such as vias 45, have been formed, the substrate 20 is subjected to a first over etch cycle 50. The first over etch cycle 50 comprises a deposition step 52 and a plasma etch step 54, which are alternately repeated n times. Each deposition step 52 or plasma etch step 54 may be performed for a time in the range 0.5 to 10 seconds. The deposition 52 and etch 54 steps may be alternately repeated at least ten times, however, the number of cycles can be any number suitable to achieve the required process end point. The direction of etching during the first over etch cycle is optimised to be aligned as far as possible with the main etching cycle 40. To achieve this, the geometry or tilt of the plasma sheath 34 during the first over etch cycle 50 must match, as far as possible, the tilt of the plasma sheath 34 during the main etch cycle 40, as shown in FIGS. 5A and 5B. The geometry or tilt of the plasma sheath 34 may be controlled by varying the platen power, the plasma density, duty cycle (DC) or by other means, such as utilising a magnetic field generated by an electromagnet or by using an auxiliary RF source. A focus ring 26 may be used as an electrode or may house an electrode in order to vary the geometry or tilt of the plasma sheath 34. The tilt of the plasma sheath corresponds to the angle at which the ions extracted from the plasma bombard the substrate surface 20. The tilt may not be uniform across the entirety of the substrate surface 20, where a variation in the tilt may, in particular, be observed at the edge of the substrate 20. References herein to an inward tilt correspond to ions bombarding the substrate surface with an inward inclination or radially inward component. That is, radially towards the centre of the substrate 20. References herein to an outward tilt correspond to ions bombarding the substrate surface with an outward inclination or radially outward component. That is, radially away from the centre of the substrate 20. FIG. 6 shows a plot of plasma tilt angle measured at 3 mm from the substrate edge for a 200 mm diameter substrate against applied platen power. In this example, a platen power of <120 W corresponds to an inward tilt, whereas a platen power of >120 W corresponds to an outward tilt. The plasma power may be pulsed where the duty cycle may also be modified to control the plasma tilt. In the first over etch cycle 50, the power applied to the platen 22 is tuned such that the tilt of the plasma sheath is aligned with the tilt used during the main etch cycle 40. Despite optimising the tilt as far as possible, asymmetries 48 will still remain in the vias 45 after the first over etch cycle 50 is complete, as shown schematically in FIG. 5B.

Figure 5C:
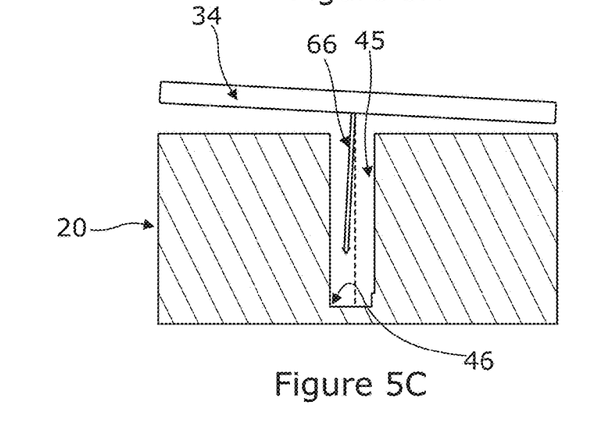
FIG. 5C is a schematic diagram of an over etch process where the plasma sheath has an outward tilt.

After the first over etch cycle 50 is complete, the substrate is subjected to a second over etch cycle 60. The second over etch cycle 60 comprises a deposition step 62 and a plasma etch step 64, which are alternately repeated p times. The plasma etch step 64 is performed using parameters giving rise to an outward plasma tilt 66. For example, a suitably high platen power may be used to distort the plasma sheath such that it has an outward tilt at the edge of the substrate 20. Each deposition step 62 or plasma etch step 64 may be performed for a time in the range 0.5 to 10 seconds. The deposition 62 and etch 64 steps may be alternately repeated at least ten times, however, the number of cycles can be any number suitable to achieve the required process end point. The second over etch cycle 60, where the direction of ion bombardment has a outward inclination (or outward tilt) with respect to the direction of ion bombardment during the first over etch cycle 50, removes asymmetries on the outermost side of the base of the via 46. The outermost side of the via 46 (that is, the side of the via 45 closest to the substrate edge) remains exposed to the ion bombardment. However the innermost side of the via 47 (that is, the side of the via 45 furthest from the substrate edge) is at least partially shielded from the ion bombardment by virtue of the aspect ratio of the via 45. As a result of the outward tilt, the etch process occurs more favourably on the outermost side of the base of the via 46 and asymmetries on this outermost side 46 are removed as shown in FIG. 5C.

Figure 5D:
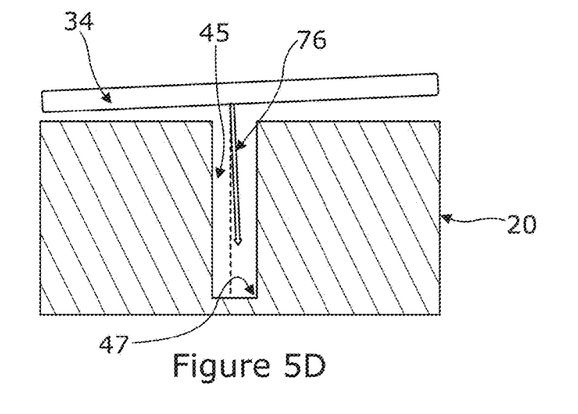
FIG. 5D is a schematic diagram of an over etch process where the plasma sheath has an inward tilt.

After the second over etch cycle 60 is complete, the substrate is subjected to a third over etch cycle 70. The third over etch cycle 70 comprises a deposition step 72 and a plasma etch step 74, which are alternately repeated q times. The plasma etch step 74 is performed using parameters giving rise to an inward plasma tilt 76. For example, no power or a suitably low power may be applied to the platen to distort the plasma sheath such that it has an inward tilt. Each deposition step 72 or plasma etch step 74 may be performed for a time in the range 0.5 to 10 seconds. The deposition 72 and etch 74 steps may be alternately repeated at least ten times, however, the number of cycles can be any number suitable to achieve the required process end point. The third over etch cycle 70, where the direction of ion bombardment has a inward inclination (or inward tilt) with respect to the direction of ion bombardment during the first over etch cycle 50, removes asymmetries on the innermost side of the base of the via 46. The innermost side of the via 46 (that is, the side of the via furthest from the substrate edge) remains exposed to the ion bombardment. However the outermost side of the via 47 (that is, the side of the via 45 closest to the substrate edge) is at least partially shielded from the ion bombardment by virtue of the aspect ratio of the via 45. As a result, the etch process occurs more favourably on the innermost side of the base of the via 46 and asymmetries on this innermost side 46 are removed as shown in FIG. 5D.

By performing a number of etch cycles and by forcing the plasma sheath tilt or geometry into a plurality of directions, the direction of ion bombardment is selectively controlled. Consequently, it is possible to eliminate artefacts or asymmetries at the base of the vias 45 even in features with a high aspect ratio, for example of 5:1 or higher.

In another embodiment the over etch cycle 70, where the plasma sheath has an inward tilt, precedes the over etch cycle 60, where the plasma sheath has an outward tilt. The invention is not limited to the order in which the over etch steps 50, 60, and 70 are performed.

Figure 7:
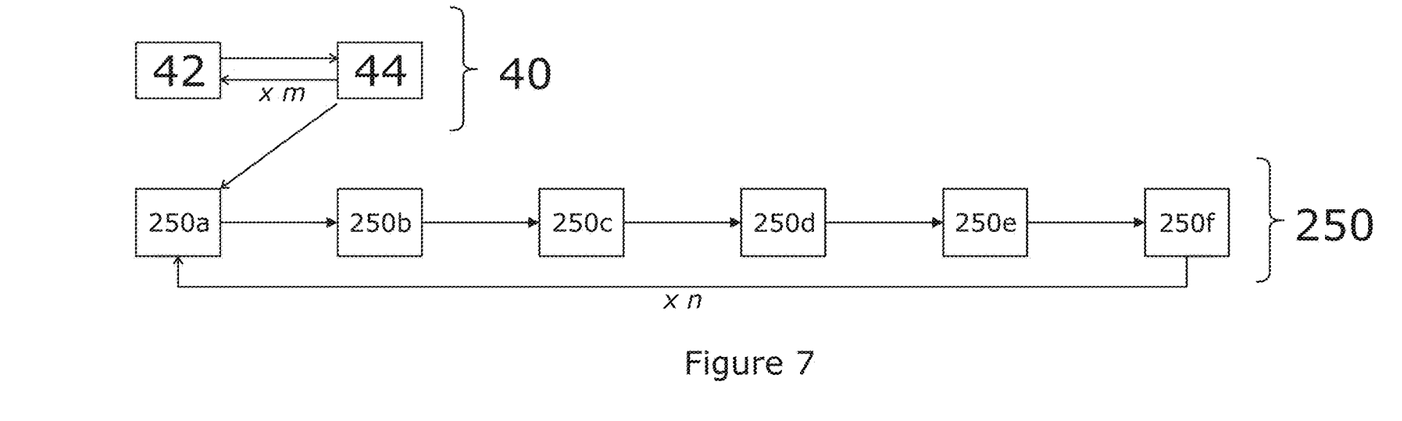
FIG. 7 is a flow diagram showing a second method of plasma etching a substrate according to the invention.

In a second embodiment there is a method for plasma etching a substrate 20 as shown by the flow chart in FIG. 7. Where the same reference numerals have been used in different exemplary embodiments, the reference numerals correspond to features that are identical. The substrate 20 is first subjected to a main etch cycle 40. The main etch cycle 40 is performed as previously described in the first embodiment of the invention.

After the main etch cycle 40 is complete, the substrate 20 is subjected to an over etch cycle 250. The over etch cycle 250 comprises the sequential steps of: a first deposition step 250a, a first plasma etch step 250b, a second deposition step 250c, a second plasma etch step 250d, a third deposition step 250e and a third plasma etch step 250f. The six steps 250a to 250f are sequentially repeated n times. Each deposition step 250a, 250c, 250e or plasma etch step 250b, 250d, 250f may be performed for a time in the range 0.5 to 10 seconds. The deposition 250a, 250c, 250e and etch 250b, 250d, 250f steps may be sequentially repeated at least ten times, however, the number of cycles can be any number suitable to achieve the required process end point. The tilt of the plasma sheath during the first plasma etch step 250b is optimised such that it is aligned, as far as possible, with the tilt of the main etch 40. The parameters used during the second plasma etch step 250d are such that the plasma sheath has an outward tilt. This removes asymmetries on the outermost side of the base of the vias 46. That is, the side of the vias nearest the edge of the substrate 20. The parameters used during the third plasma etch step 250f are such that the plasma sheath has an inward tilt. This removes asymmetries on the innermost side of the base of the vias 47. That is, the side of the vias furthest away from the edge of the substrate 20. The invention is not limited by the order of the plasma etch steps 250b, 250d, 250e. By forcing the plasma sheath tilt or geometry into a plurality of directions, the direction of ion bombardment is selectively controlled. Consequently, it is possible to eliminate artefacts or asymmetries at the base of the vias 45. Overall, artefacts or asymmetries in the vias are removed.

Figure 8:
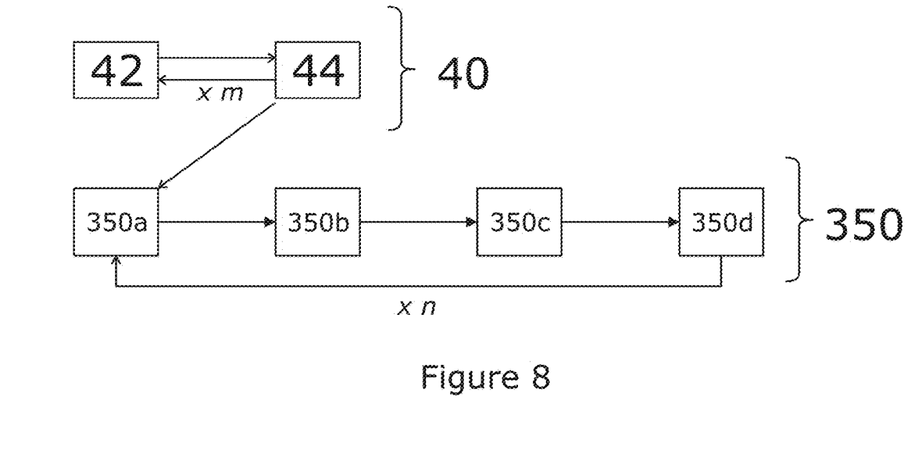
FIG. 8 is a flow diagram showing a third method of plasma etching a substrate according to the invention.

In a third embodiment there is a method for plasma etching a substrate 20 as shown by the flow chart in FIG. 8. Where the same reference numerals have been used in different exemplary embodiments, the reference numerals correspond to features that are identical. The substrate 20 is first subjected to a main etch cycle 40. The main etch cycle 40 is performed as previously described in the first embodiment of the invention.

After the main etch cycle 40 is complete, the substrate 20 is subjected to an over etch cycle 350. The over etch cycle 350 comprises the sequential steps of: a first deposition step 350a, a first plasma etch step 350b, a second plasma etch step 350c, and a third plasma etch step 350d. The four steps 350a to 350d are sequentially repeated n times. Each deposition step 350a or plasma etch steps 350b, 350c, 350d may be performed for a time in the range 0.5 to 10 seconds. The deposition 350a and etch 350b, 350c, 350d steps may be sequentially repeated at least ten times, however, the number of cycles can be any number suitable to achieve the required process end point. The tilt of the plasma sheath during the first plasma etch step 350b is optimised such that it is aligned, as far as possible, with the tilt of the main etch 40. The parameters used during the second plasma etch step 350c are such that the plasma sheath has an outward tilt. This removes asymmetries on the outermost side of the base of the vias 46. That is, the side of the vias nearest the edge of the substrate 20. The parameters used during the third plasma etch step 350d are such that the plasma sheath has an inward tilt. This removes asymmetries on the innermost side of the base of the vias 47. That is, the side of the vias furthest away from the edge of the substrate 20. The invention is not limited by the order of the plasma etch steps 350b, 350c, 350d. By forcing the plasma sheath tilt or geometry into a plurality of directions, the direction of ion bombardment is selectively controlled. Consequently, it is possible to eliminate artefacts or asymmetries at the base of the vias 45. Overall, artefacts and asymmetries in the vias are removed.

It will be appreciated by the skilled reader that various modifications and variations can be made to the described embodiments. For example, different etching and deposition recipes might be used. A further step, such as a passivation step, may be used in conjunction with any of the etch steps. It may be possible to dispense with one of the etch steps in the over etch and instead utilise two etch steps in the over etch in order to produce highly symmetrical features.

What is claimed is:

1. A method of plasma etching one or more features in a silicon substrate, the method comprising the steps of:
   performing a main etch using a cyclical etch process in which a deposition step and an etch step are alternately repeated; and
   performing an over etch to complete the plasma etching of the features;
   in which:
   the over etch comprises one or more etch steps of a first kind and one or more etch steps of a second kind, each of the etch steps of the first and second kind comprising etching by ion bombardment of the silicon substrate; and
   ion bombardment during the one or more etch steps of the second kind has an inward inclination with respect to ion bombardment during the one or more etch steps of the first kind.

2. A method according to claim 1 in which the over etch further comprises one or more etch steps of a third kind, the one or more etch steps of the third kind comprising etching by ion bombardment of the silicon substrate; and wherein ion bombardment during the one or more etch steps of the third kind has an outward inclination with respect to ion bombardment during the one or more etch steps of the first kind.

3. A method according to claim 1 in which the inclination of the ion bombardment during the over etch is controlled using an electrical bias power which is applied to the substrate to produce an electrical bias.

4. A method according to claim 3 in which the electrical bias power is an RF power.

5. A method according to claim 3 in which the electrical bias power is pulsed during one or more of the etch steps of the first, second and third kind.

6. A method according to claim 5 in which the electrical bias power is pulsed with a duty cycle in the range of 10 to 50% during one or more of the etch steps of the first, second and third kind.

7. A method according to claim 3 in which the electrical bias power is applied to the substrate continuously during one or more of the etch steps of the first, second and third kind.

8. A method according to claim 3 in which the inward inclination of the ion bombardment during the one or more etch steps of the second kind is controlled by reducing the magnitude of the electrical bias power in comparison to the electrical bias power applied during the one or more etch steps of the first kind.

9. A method according to claim 3 in which the outward inclination of the ion bombardment during the one or more etch steps of the third kind is controlled by increasing the magnitude of the electrical bias power in comparison to the electrical bias power applied during the one or more etch steps of the first kind.

10. A method according to claim 1 in which the features are vias.

11. A method according to claim 10 in which the features are Through Silicon Vias (TSVs).

12. A method according to claim 1 in which the features have an aspect ratio of at least 5:1.

13. A method according to claim 2 in which the over etch comprises a plurality of etch steps of the first kind, a plurality of etch steps of the second kind and a plurality of etch steps of the third kind.

14. A method according to claim 13 in which the over etch comprises the steps of:
   performing an etch cycle comprising a deposition step and an etch step of the first kind, whereby the deposition step and the etch step of the first kind are alternately repeated;
   performing an etch cycle comprising a deposition step and an etch step of the second kind, whereby the deposition step and the etch step of the second kind are alternately repeated; and
   performing an etch cycle comprising a deposition step and an etch step of the third kind, whereby the deposition step and the etch step of the third kind are alternately repeated.

15. A method according to claim 13 in which the over etch comprises the steps of:
   performing an etch cycle comprising at least one deposition step, an etch step of the first kind, an etch step of the second kind and an etch step of the third kind; and
   repeating said etch cycle.

16. A method according to claim 15 in which each etch step of the first, second and third kind in the etch cycle is preceded by a corresponding deposition step.

17. A method according to claim 15 in which the etch cycle comprises a single deposition step followed by etch steps of the first, second and third kind.

18. A method according to claim 1 in which the etch steps of the first, second and third kind are performed using a plasma formed using a fluorine containing gas.

19. A method according to claim 1 in which the over etch comprises at least one deposition step which is performed using a plasma formed using a fluorocarbon.

* * * * *